US008618796B2

(12) United States Patent  
Teppan et al.

(10) Patent No.: US 8,618,796 B2  
(45) Date of Patent: Dec. 31, 2013

(54) ELECTRICAL CURRENT SENSOR

(75) Inventors: Wolfram Teppan, Collonges-sous-Saleve (FR); Dominik Schlafli, Nyon (CH)

(73) Assignee: LEM Intellectual Property SA, Fribourg (CH)

( * ) Notice: Subject to any disclaimer, the term of this patent is extended or adjusted under 35 U.S.C. 154(b) by 810 days.

(21) Appl. No.: 12/735,529

(22) PCT Filed: Jan. 21, 2009

(86) PCT No.: PCT/IB2009/050210
§ 371 (c)(1),
(2), (4) Date: Jul. 23, 2010

(87) PCT Pub. No.: WO2009/093178
PCT Pub. Date: Jul. 30, 2009

(65) Prior Publication Data
US 2010/0301852 A1 Dec. 2, 2010

(30) Foreign Application Priority Data

Jan. 25, 2008 (EP) .................................. 08001417

(51) Int. Cl.
*G01R 33/04* (2006.01)
(52) U.S. Cl.
USPC .................. 324/253; 324/127; 324/117 H

(58) Field of Classification Search
USPC ...................... 324/253, 127, 117 H
See application file for complete search history.

(56) References Cited

FOREIGN PATENT DOCUMENTS

DE    10 2005 028 572 A1    12/2006
EP    0 510 376 A1    10/1992
WO    WO 2006/008629 A1    1/2006

OTHER PUBLICATIONS

International Search Report and Written Opinion for PCT/IB2009/050210 issued by the European Patent Office on May 29, 2009.

*Primary Examiner* — Reena Aurora
(74) *Attorney, Agent, or Firm* — Faegre Baker Daniels LLP

(57) ABSTRACT

Closed-loop current sensor comprising a magnetic circuit, a magnetic field sensor, and a compensation circuit configured to generate a magnetic field opposing a magnetic field created by an electrical current to be measured flowing in one or more primary conductors (10) extending through a central opening (38) of the magnetic circuit. The magnetic circuit comprises a magnetic core (4) made of at least two core parts (28a, 28b) assembled together to form a substantially closed magnetic circuit, wherein a second branch (32) of the magnetic circuit comprises inner (40a, 40b) and outer (42a, 42b) wall portions joined by one or more lateral wall portions (46a, 46b, 46a', 46b') at least partially surrounding a cavity portion (44) receiving the magnetic field sensor (8) therein, the lateral and outer wall portions extending from one or both lateral edges of the inner wall portion.

24 Claims, 6 Drawing Sheets

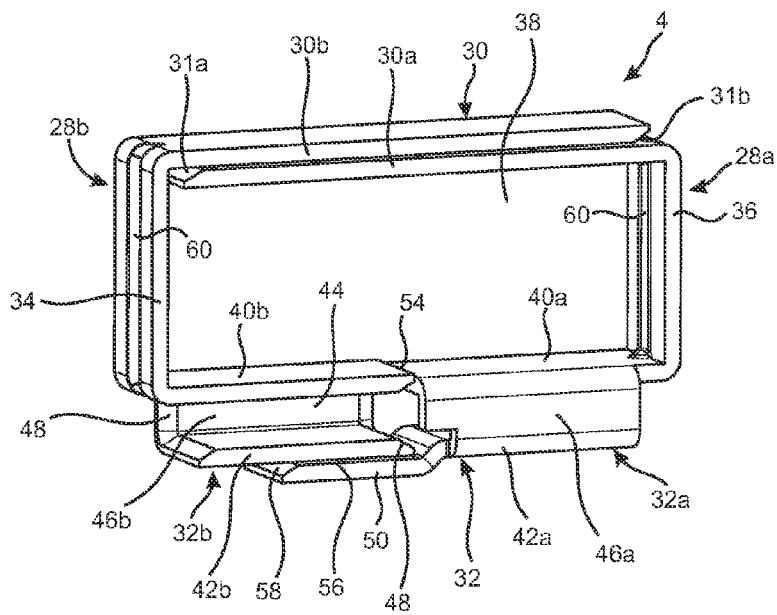
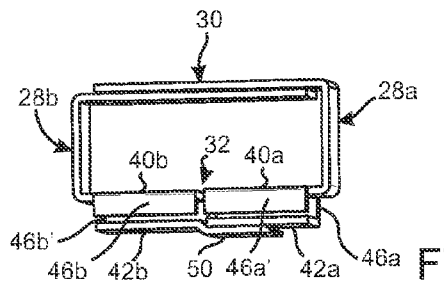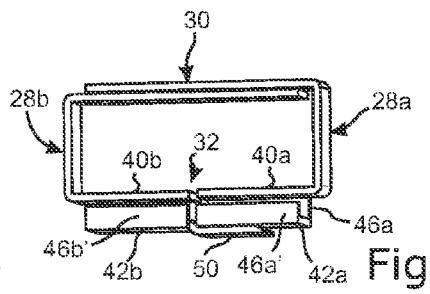
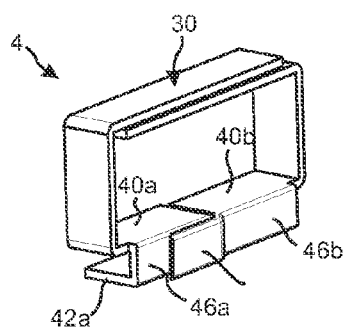
Fig. 2d
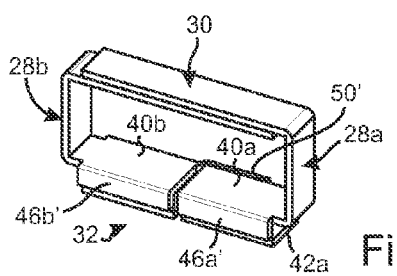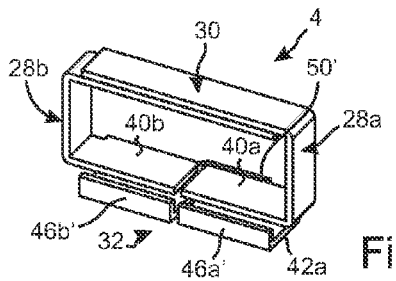

ELECTRICAL CURRENT SENSOR

The present invention relates to an electrical current sensor with a magnetic circuit and a magnetic field sensor.

The invention in particular (but not only) concerns current sensors of the closed-loop type, having a compensation circuit with secondary coils for cancelling the magnetic flux induced in the magnetic circuit.

Closed-loop current sensors and are widely used in a large number of current and voltage measurement applications. In such sensors, the magnetic flux in the magnetic circuit is very low, since the compensation circuit is driven in a feedback loop to cancel the magnetic field induced by the current to be measured (primary current), the resultant magnetic field being picked up by a magnetic field sensor which thus needs to have a high sensitivity for accurate and rapid response of the current sensor.

Various magnetic field sensors including Hall effect detectors, pick-up coils, or fluxgate sensors, may be employed in so-called closed-loop current sensors. The magnetic field detector may be arranged in an air-gap of the magnetic circuit, or in a partial air-gap, or in proximity of an air-gap, or simply in proximity or around a branch of the magnetic circuit.

In order to reduce the influence of external magnetic fields, considering the sensitivity of certain magnetic field sensors, it is advantageous to position the magnetic field sensor within the magnetic core or alongside the inner periphery, as opposed to an outer side of the magnetic coil where external magnetic fields have a greater influence on the magnetic field sensor.

A closed-loop current sensor with a sensitive magnetic field detector is for example described in German patent application DE 102005028572. In the latter publication, the current sensor has a magnetic core that is made of a uniform width strip of soft magnetic material (i.e. material with a high magnetic permeability) folded into two identical parts that are assembled together in mirror symmetry. The magnetic core has extensions forming a space therebetween within which a magnetic field fluxgate sensor is positioned. The space for the magnetic field detector is bounded by an outer pair and an inner pair of arms, the outer pair being supposedly in edge abutting relationship, and the inner pair of arms supposedly providing an air-gap.

Discontinuities in the magnetic circuit, such as between the abutting outer arms of the magnetic circuit, have a parasitic air-gap effect that influences the measurement accuracy and response of the sensor. A slight variation in the degree of contact between the abutting edges, or the creation of a slight gap, may have an important effect on the magnetic flux lines and thus the measurement accuracy of the sensor. The sensor described in the aforementioned publication is thus very sensitive to assembly accuracy and repeatability. The magnetic core is made of folded strip material that has a low rigidity and requires careful handling during manufacture and assembly. Moreover, the magnetic fluxgate sensor positioned in the space between first and second pairs of arms is also somewhat exposed to external field influences from the open sides.

In view of the various applications in which current sensors of a closed-loop type, but also of the open loop type, may be used, there is also a need for sensors with various operating ranges that may be produced in a cost-effective manner.

German patent DE 40 17 280 describes a current sensor comprising a plurality of U-Shaped primary conductor portions for connection to an external circuit board, whereby the U-Shaped primary conductor portions that can be interconnected in different configurations on the circuit board to form one or windings. This allows the sensor to be easily configurable for different operating current ranges. The primary conductor portions are however assembled partially in the housing and set in resin or over-molded, such that a change in the number or position of the primary conductor portions, if desired, would require expensive tooling changes.

It is an object of this invention to provide an electrical current sensor that is accurate and yet economical to manufacture It is advantageous to provide a current sensor that is easy and economical to assemble.

It is an object of this invention to provide a current sensor that is versatile, in particular can be easily made for different operating ranges.

It is advantageous to provide a closed-loop electrical current sensor that has a good resistance to external field influences.

It is advantageous to provide a closed-loop electrical current sensor that is robust and reliable.

It is advantageous to provide a closed-loop electrical current sensor that is compact.

Various objects of this invention have been achieved by providing the current sensors according to claims 1, 15, 17 and 22.

Disclosed herein is a current sensor comprising a housing, a magnetic circuit with a central opening, a magnetic field sensor, and one or more essentially U-shaped primary conductor portions extending partially around a branch of the magnetic circuit, wherein the housing comprises a plurality of preformed primary conductor guide cavities extending between opposed lateral outer faces of the housing through the central opening of the magnetic circuit, the preformed primary conductor guide cavities configured for insertion, after assembly of the magnetic field sensor and magnetic circuit in the housing, of said one or more primary conductor portions therethrough, and wherein the sensor has less primary conductor portions than preformed primary conductor guide cavities.

Also disclosed herein is a closed-loop current sensor comprising a magnetic circuit, a magnetic field sensor, and a compensation circuit configured to generate a magnetic field opposing a magnetic field created by an electrical current to be measured flowing in one or more primary conductors extending through a central opening of the magnetic circuit, the magnetic circuit comprising a magnetic core made of at least two core parts assembled together to form a substantially closed magnetic circuit, wherein a branch of the magnetic circuit comprises inner and outer wall portions joined by lateral wall portions surrounding a cavity portion receiving the magnetic field sensor therein, the lateral and outer wall portions being bent and extending from a lateral edge of the inner wall portion.

Preferably, the outer wall portion of one of the magnetic core parts comprises an extension overlapping the outer wall portion of the branch of the other magnetic core part. An air-gap may advantageously be formed between end edges of the inner wall portions.

The folded lateral and outer wall portions, and the overlapping outer wall portion provide an accurate and reliable air-gap effect between the magnetic core parts, in addition to shielding from external fields, thus enabling accurate and reliable current measurement. The magnetic core parts may be advantageously manufactured by stamping and forming from sheet metal in a cost-effective manner on an industrial scale. The above-mentioned configuration of the branch forming the cavity within which the magnetic field sensor is inserted, is easy to assemble and is not particularly sensitive to assembly tolerances and is thus economical to manufacture.

The magnetic core may have a substantially parallelepipedic shape with opposed side branches joining opposed first and second branches. The first and second branches are split in view of the separate core parts.

The first and second branches of the magnetic core may be inserted in cavities of coil supports of the secondary circuit. The secondary circuit may advantageously comprise a pair of coils, one wound around each coil support extending around first and second branches of the magnetic circuit.

The side branches of the magnetic circuit interconnecting the opposed first and second branches may advantageously comprise a reinforcement in the form of a ridge or embossing performed during the stamping operation forming the magnetic core parts.

The magnetic field sensor may advantageously comprise a dielectric support, a fluxgate core mounted thereon and a fluxgate coil wound around the support and fluxgate core. Electrical terminals may advantageously be securely fixed to the support, preferably by over-moulding the support on portions of the electrical terminals, or by stitching the terminals in a force-fit manner in corresponding lodgings of the support, the terminals comprising coil connection portions for electrical connection to ends of the coil and terminal portions for connection of the magnetic field detector to a signal processing circuit. The terminals of the fluxgate sensor may advantageously be arranged at an end of the sensor projecting out of an end of a cavity of the secondary coil support, for connection to a circuit board arranged adjacent respective ends of first and second coils of the secondary circuit.

The sensor may advantageously comprise an internal signal processing circuit comprising a circuit board with electrical contacts connected to terminals of the magnetic field detector and to the coils of the secondary circuit, the circuit board advantageously being mounted along a face of a respective end of the secondary circuit coils. This enables the sensor to be compact, in particular to have a relatively low height when mounted on a circuit board. Moreover, the connections between the circuit board of the signal processing circuit and the coils and magnetic field detector have short paths and are easily accessible, for instance for soldering the connections.

The signal processing circuit comprises terminals for connection to an external unit, i.a. for power supply and transmission of the measurement signal, the terminals advantageously projecting from a mounting face of the sensor configured for mounting on an external circuit board.

The sensor may advantageously comprise one or more essentially U-shaped primary conductor portions extending partially around the second branch of the magnetic circuit receiving the magnetic field detector. Primary conductor portions may advantageously be provided with terminals projecting beyond a mounting face of the sensor for connection to an external circuit board.

The sensor housing, may advantageously comprise a plurality of preformed primary conductor guide cavities extending between opposed lateral outer faces of the housing through the central opening of the magnetic circuit. The preformed primary conductor guide cavities are configured for insertion, after assembly of the magnetic field sensor and magnetic circuit in the housing, of one or more primary conductor portions therethrough, wherein the sensor has less primary conductor portions than preformed primary conductor guide cavities. The number and position of primary conductors assembled to the housing may be selected according to the desired operating range of the current sensor. The housing may further advantageously comprise guide slots along the lateral outer walls of the housing, proximate the mounting face for positioning the lateral branches of the primary conductor portions. The U-shaped primary conductor portion may be bent so that it extends through a guide slot positioned in a plane orthogonal to a mounting face that is offset from a plane parallel thereto extending through the corresponding cavity through which the U-shaped primary conductor extends. The bent primary conductor portions may advantageously increase the creepage distance between the primary conductors and the terminals of the compensation circuit (secondary conductors).

Further objects and advantageous aspects of the invention will be apparent from the claims, the following detailed description, and drawings in which:

FIG. 1b is a perspective exploded view of the current sensor embodiment of FIG. 1a;

FIG. 2a is a perspective view of a magnetic circuit of the sensor shown in FIG. 1;

FIGS. 2b to 2f are perspective views of variants of the magnetic circuit;

Figure 1A:
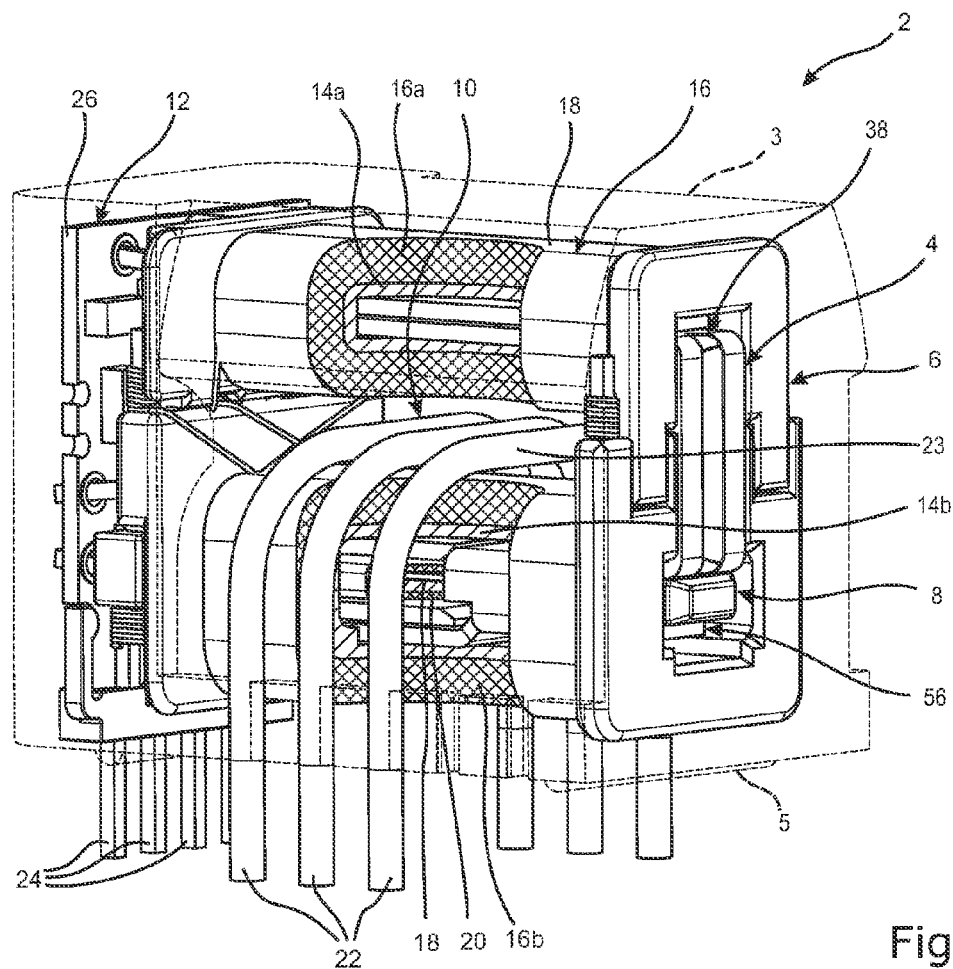
FIG. 1a is a view in perspective and partial cross-section of a current sensor according to an embodiment of this invention with the housing removed (shown in dotted line)

Referring to the Figures, in particular FIG. 1a, an electrical current sensor 2 comprises a housing 3 (shown in outline), a magnetic circuit 4, a compensation circuit 6, a magnetic field detector 8, and a signal processing or connection circuit 12. The compensation circuit is also referred to herein as the secondary circuit.

The current sensor may further comprise primary conductor portions 10, preferably having U-shaped configurations with connection terminal ends 22 projecting beyond a mounting face 5 of the housing.

Referring in particular to FIG. 2a, the magnetic circuit comprises a magnetic core formed of at least two core parts 28a, 28b, that, when assembled together, form a substantially closed circuit with opposed first and second branches 30, 32, interconnected by end branches 34, 36, surrounding a central opening 38 through which the primary conductors can pass. The first branch 30 is formed by overlapping first branch portions 30b, 30a, of respective core parts 28b, 28a. The first branch portions preferably have chamfered free ends 31a, 31b, to facilitate their insertion and assembly in a corresponding cavity 38 of a support 14a, 14b of one of the secondary coils 16 (see FIG. 1). When assembled in the cavity, the branch portions 30a, 30b, are pressed together in order to reduce the parasitic air-gap effect between the branch portions, i.e. to improve the conductance of magnetic flux.

The second branch 32 is formed by branch portions 32a, 32b, extending from respective ends of the side branches 34, 36 of the respective magnetic core parts 28a, 28b. The second branch 32 comprises inner wall portions 40a, 40b, and outer wall portions 42a, 42b, forming therebetween a cavity 44 for receiving the magnetic field detector 8 therein. The inner and outer wall portions are integrally interconnected by respective lateral wall portions 46a, 46b. In the embodiment shown, the lateral wall portion 46b of one core part 28b is arranged on an opposite side of the cavity 44 from the lateral wall portion 46a of the other core part 28a.

The core parts 28a, 28b, may advantageously be stamped and formed from a sheet of metal alloy having a high magnetic permeability, whereby the lateral and outer wall portions of the second branch are folded out of the plane of the inner wall portions during the stamping procedure.

As shown in variants of FIGS. 2b, 2c and 2e, 2f, the second branch 32 may also be provided with lateral wall portions 46a, 46a' and 46b, 46b' on both sides of the cavity 44. In the variants of FIGS. 2c, 2f the sheet metal wraps around from one lateral edge of the inner wall portion around to the other lateral edge. In the variants of FIGS. 2b, 2e, the sheet metal is bent from both lateral edges of the inner wall portion 40a, 40b to join along a lateral edge of the outer wall portion 42a, 42b.

Free end edges of the lateral and outer wall portions may advantageously be provided with chamfers 48 to facilitate insertion of the magnetic field detector 8 in the second branch cavity 44.

As best seen in FIGS. 2a, 2b, 2c, the outer wall portion 42a of a core part 28a advantageously comprises an outer extension 50 overlapping a section of the outer wall portion 42b of the other core part 28b. The outer wall portions 42a, 42b, of the two core parts 28a, 28b, are preferably arranged in essentially the same plane, whereby the outer extension 50 is offset, so that it lies against an outer face of the outer wall portion of the other core part. The offset is created by a substantially S-shaped bend 52 positioned close to the center of the second branch portion.

Opposed free end edges 53a, 53b of the inner wall portions 40a, 40b, form therebetween an air-gap 54. The interface 56 between the overlapping outer extension 50 and outer wall portion 42b also forms an air-gap influencing the magnetic flux traversing the magnetic field detector, as do the openings on the sides of the cavity 44. Operation and control of the magnetic field detector takes into account the presence of the air-gaps and openings. The overlapping relationship of the extension 50 with the outer wall portion 42b of the two core parts however substantially reduces the influence of manufacturing tolerances, as compared to a configuration where opposed free end edges of the outer wall core portions were to abut, whereby slight differences in gap size would have an important effect on the magnetic flux lines and thus the measurement signal. The outer wall extension 50 also provides a shielding effect reducing the influence of external magnetic field influences on the measurement signal. The extension 50 and outer wall portion 42b are in contact against each other and are pressed together by the opposed walls of the cavity 56 in the support body 15 of the second coil 16b of the compensation circuit (see FIG. 1). The two core parts 28a, 28b, are inserted into the respective cavities 38, 56, of the coil supports from opposed ends, whereby a chamfer 58 may advantageously be provided on the free end edge of the extension 50 to facilitate insertion and guiding with respect to the outer wall portion 42b of the other core part.

As shown in FIGS. 2d-2f, a lateral wall extension 50' extending from a lateral wall portion 46b overlapping a section of the lateral wall portion 46a of the other core part 28a, may also be provided. The lateral wall extension 50' may be provided in addition to the outer wall extension 50, or instead of the outer wall extension. It is also possible to provide lateral wall extensions on either side (i.e. on both lateral walls) and/or on the inner wall 40a, 40b for better shielding and/or better control or optimization of the air-gap coupling the two magnetic circuit parts around the cavity 44 in which the magnetic field detector 8 is received.

The side branches 34, 36, interconnecting the first and second branches may advantageously comprise a stiffening ridge or embossment 60, formed during the stamping operation of the core parts, thus strengthening the core parts and reducing the risk of deformation during manufacturing, handling, and assembly.

The latter also ensures a better parallelism of the end branches 34, 36, and the first and second branches 30, 32 once assembled in the housing 3.

Figure 1B:
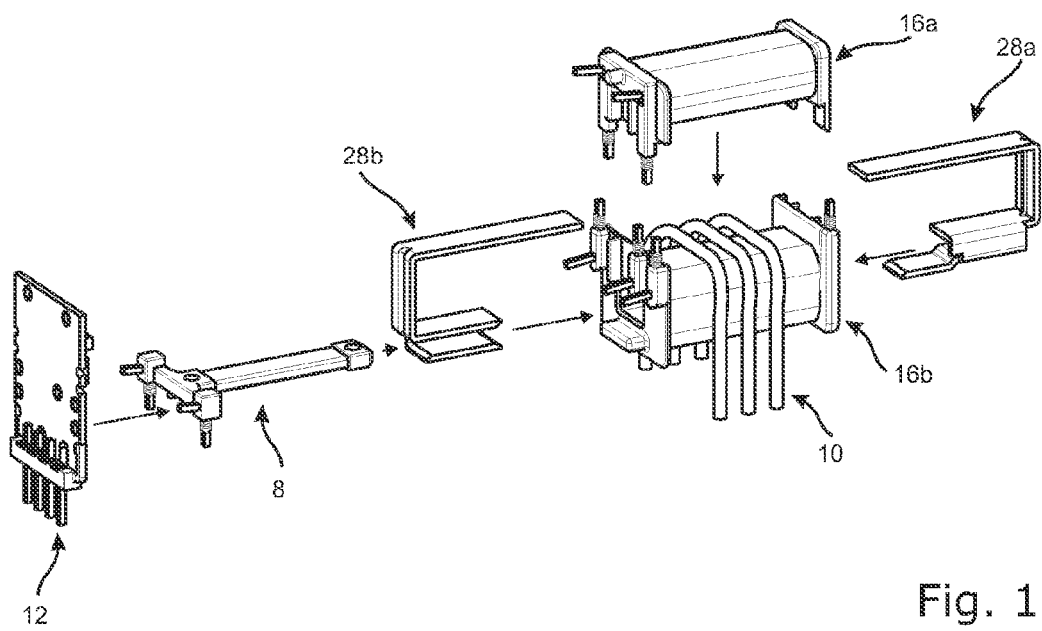
Figure 3A:
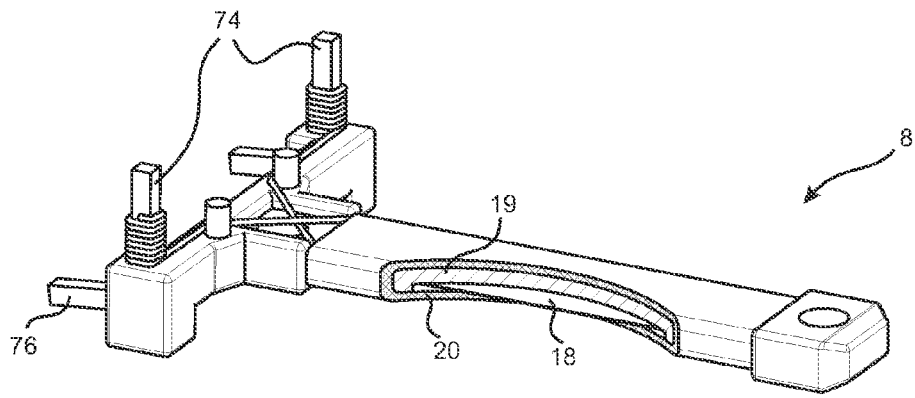
FIG. 3a is a perspective view of with partial cross-section of a magnetic field detector of a current sensor according to an embodiment of this invention.
Figure 3B:
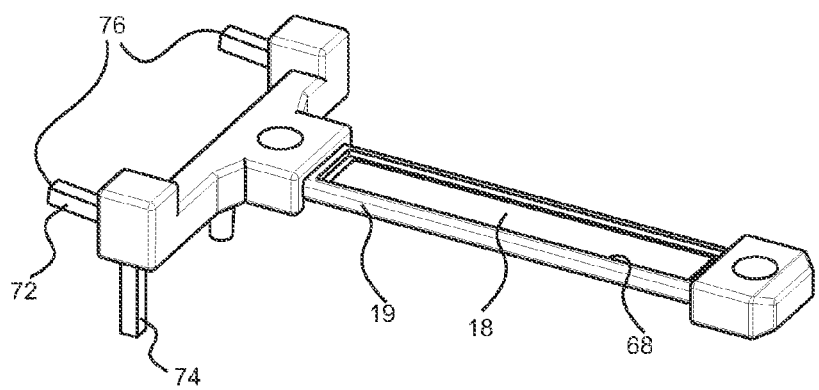
FIG. 3b is a perspective view of the magnetic field detector with the coil removed.

Referring to FIG. 3, and to FIG. 1, the magnetic field detector in the current sensor embodiment illustrated is a fluxgate sensor comprising a fluxgate core 62 which may advantageously be in the form of a strip of ferromagnetic amorphous material, for example cobalt based alloys like the alloy 2714A from Hitachi Metals/Metglas mounted in or on a dielectric support 64 that may for example advantageously be formed from injected plastic, and a fluxgate coil 20 wound around a section of the support 64 and the fluxgate core thereon or therein. In the embodiment shown, the fluxgate core 18 is mounted in an indent 68 of the support 19. The fluxgate core, however, may be in the form of a cylindrical or rectangular rod or take on other shapes and may also be mounted in a cavity within the support 64.

The fluxgate core may also be over-molded by the support. The section of support 19 lodging the fluxgate core may advantageously also act as a coil former for the winding of the fluxgate coil 20 therearound. Coil connection terminals 72 may advantageously be mounted in the support 19, for example by over-moulding or by stitching in predisposed cavities in the support. In the embodiment illustrated, the terminals are over-molded. The terminals 72 comprise a pair of connection ports 74 for connecting to respective ends of the fluxgate coil windings, and circuit board terminal ends 76 for connection to the circuit board 26 of the signal processing circuit 12. The magnetic field detector 8 may advantageously be inserted into the cavity 44 of the magnetic circuit 4, after assembly of the core parts to the coil supports of the compensation circuit, whereby the terminal ends 76 thereof project in the direction of the circuit board orthogonal to the sensor mounting face 5, likewise with the terminal ends 83a, 83b of the secondary coils (see FIG. 4). This configuration is compact and easy to assemble.

Figure 4:
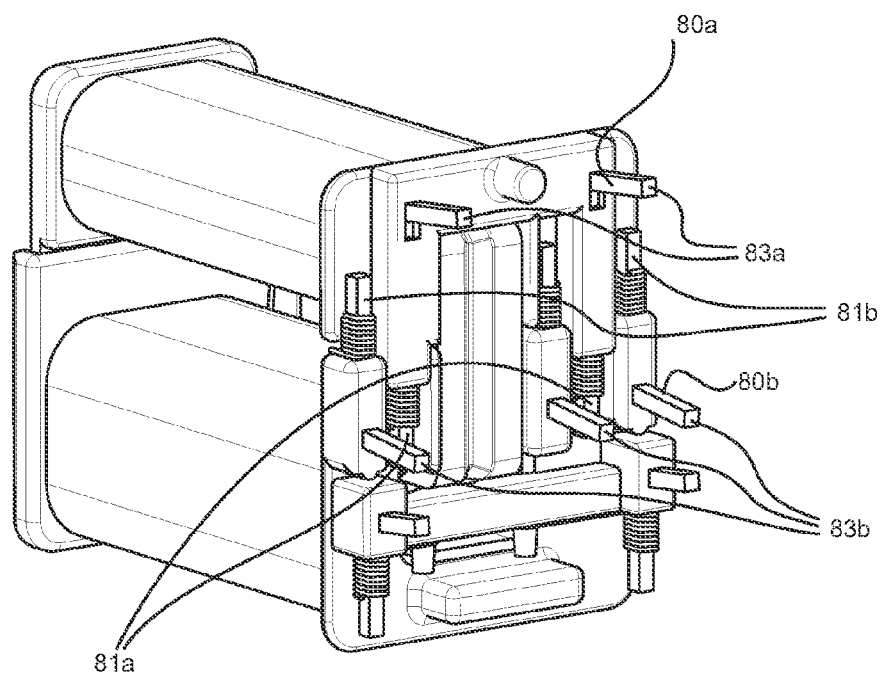
FIG. 4 is a view in perspective of parts of the current sensor of FIG. 1 showing an assembly of the secondary (compensation) circuit and magnetic circuit.
Figure 5:
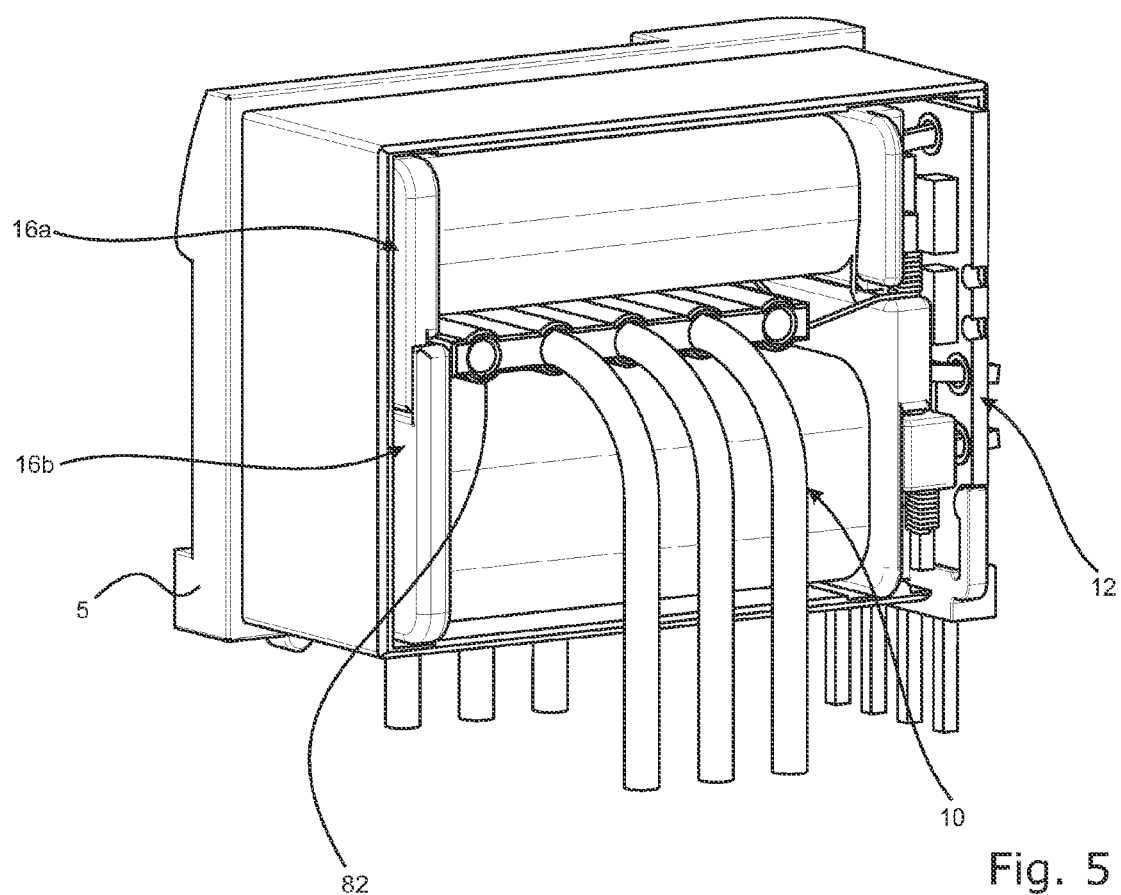
FIG. 5 is a view in perspective of a current sensor according to this invention, with a portion of housing removed.

Referring to FIG. 4, in conjunction with FIG. 1, the compensation circuit preferably comprises two coils 16a, 16b, one surrounding the first branch of the magnetic circuit, and the other surrounding the second branch of the magnetic circuit, in which the magnetic field detector is mounted. The secondary coils 16a, 16b, are mounted on respective coil supports 14a, 14b, that may advantageously be made of injected plastic. In the embodiment illustrated, the two coils have separate windings, each with a pair of connection ends. Alternatively the two coil supports may be integrally connected via an integrally molded connection hinge that enables the coil supports to be essentially aligned for winding of the coils thereon and subsequently folded together to the assembled position similar to what is illustrated in FIG. 4. In the latter embodiment, the two coils may thus be formed from a single wire winding with only two connection ends, the wire from one coil to the next passing in proximity of the hinge interconnecting the supports.

Coil connection terminals 80a, 80b, may advantageously be mounted in the respective coil supports, the terminals having contact posts 81a, 81b for connection of the coil ends, and circuit board terminal ends 83a, 83b for connection to the signal processing and connection circuit 12. The coil connection terminals 80a, 80b may advantageously be over-molded by the coil supports or mounted therein by stitching or other means.

The coil support may further advantageously house a compensation circuit connection terminal 24, having terminal ends for connection to an external circuit, and circuit board connection ends 24b for connection to the signal processing connection circuit 12.

The signal processing circuit 12 may advantageously be arranged along a face of the sensor at an end of the coils. This advantageously allows the overall height of the sensor to be as low as possible, and enable compact and easy connection of the circuit board to the various connection terminals of the compensation circuit and magnetic field detector.

Referring to FIGS. 5 and 6a to 6d, the sensor housing 3 is advantageously provided with a plurality of preformed through-cavities 82 positioned between the compensation circuit coils 16a, 16b, and traversing the central cavity 38 of the magnetic circuit 4. The through-cavities 82 may advantageously be aligned and arranged at a regular spacing one from the other and configured to receive and mount intermediate portions 23 of the U-shaped primary conductors 10. The cavities may have any shape (for instance circular as shown, square, rectangular or polygonal) adapted to the cross-sectional profile of the primary conductors.

The housing may advantageously further comprise guide channels 84 arranged on opposite side faces of the housing for receiving and positioning arms of the U-shaped primary conductors. The channels 84 thus advantageously assist in accurate positioning of the connection ends 22 of the primary conductors which, for example, may be in form of pin terminal ends, as shown in the embodiments illustrated, for connection to an external circuit board.

The connection ends of the primary conductors as well as of the secondary conductors may however also be configured for pluggable connection to an external connector, or as surface mount terminal ends for surface mount connection on contact pads of a circuit board.

The primary conductors can advantageously be mounted to the current sensor after assembly of the signal processing circuit, secondary coils and housing, by insertion through the pre-formed cavities 82 of linear lengths of wire or other rod-shaped parts, where the ends are subsequently bent to form the U-shape of the primary conductor, the side arms being snapped into the corresponding housing channels 84.

The primary conductors can be provided in any number or any position in the plurality of available through cavities, depending on the desired operating range of the sensor. The lateral arms of the U-shaped primary conductors may be offset with respect to their respective intermediate portions 23. In other terms, the U-shaped primary conductor portion is bent so that it extends through a guide slot positioned in a plane orthogonal to a mounting face that is offset from a plane parallel thereto extending through the corresponding pre-formed cavity through which the U-shaped primary conductor extends. This configuration increases the distance separating the primary windings and the secondary terminals 24 and thus the electrical creepage path on the external circuit board to which the electrical current sensor is intended to be mounted.

Figure 6A:
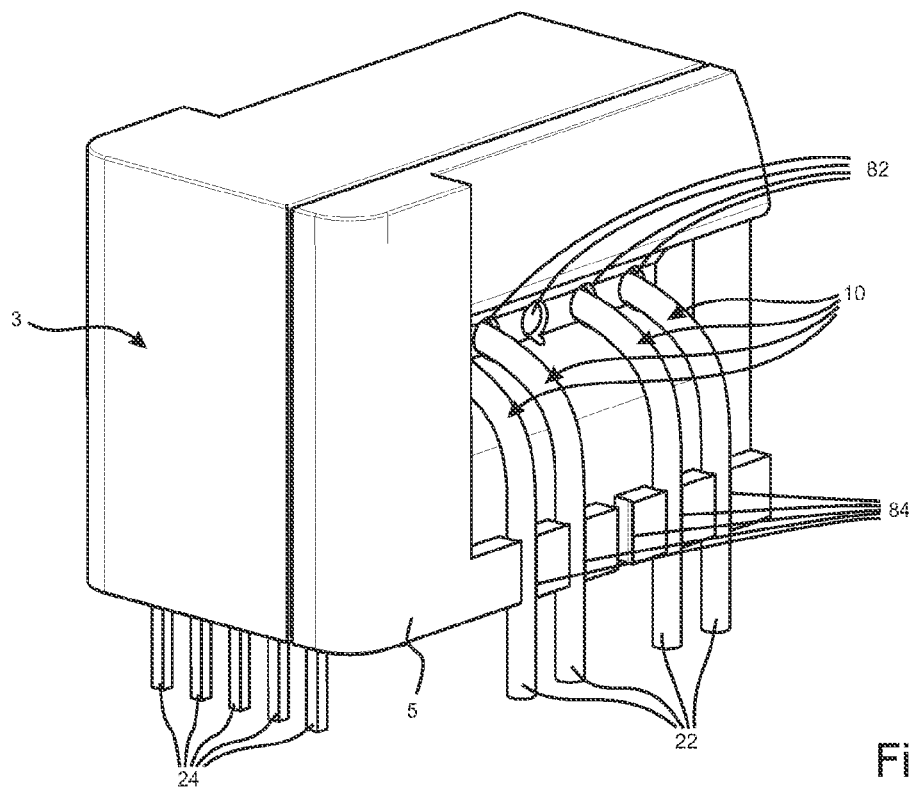
FIG. 6a is a view in perspective of a current sensor according to this invention, with an arrangement of primary conductors according to a first variant.
Figure 6B:
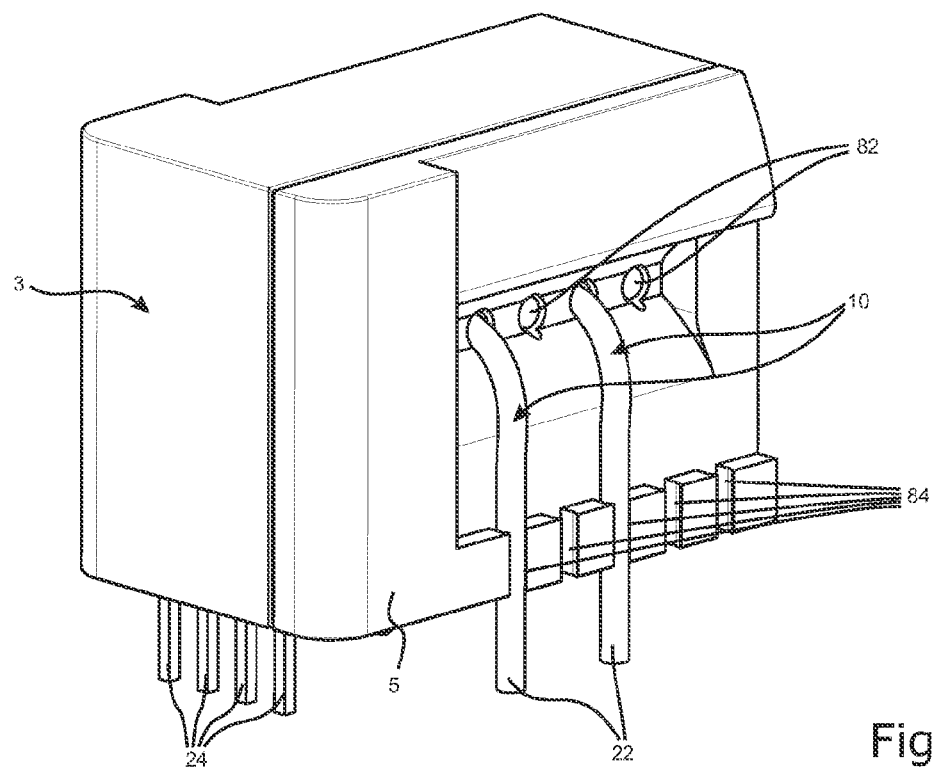
FIG. 6b is a view similar to FIG. 6a, showing a primary conductor arrangement according to a second variant.
Figure 6C:
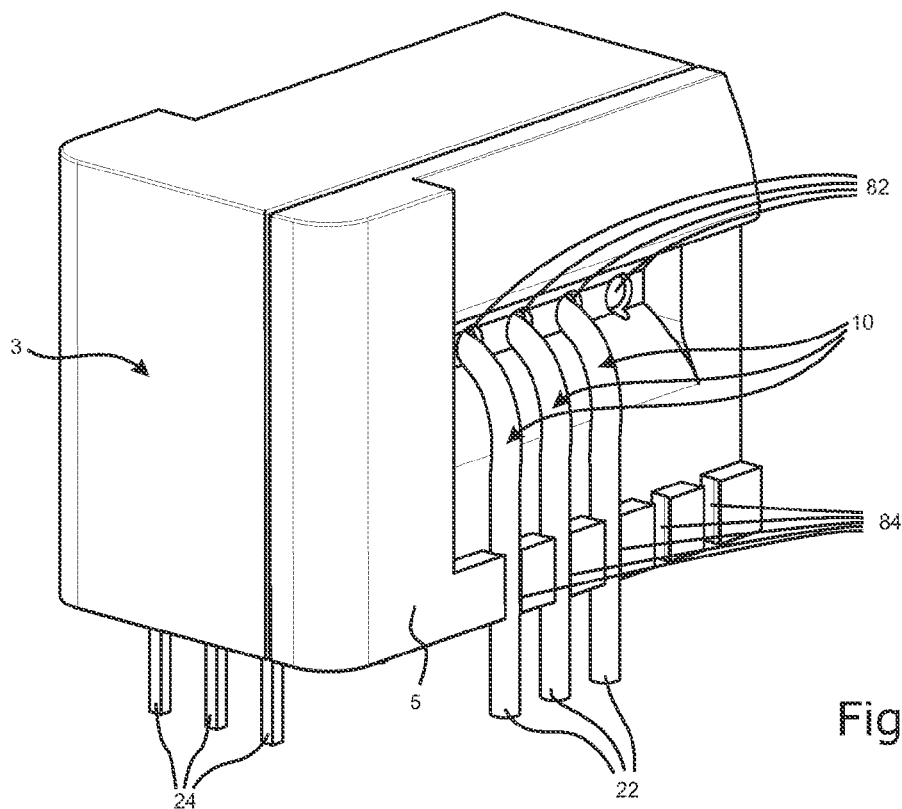
FIG. 6c is a view similar to FIG. 6a, showing a primary conductor arrangement according to a third variant.
Figure 6D:
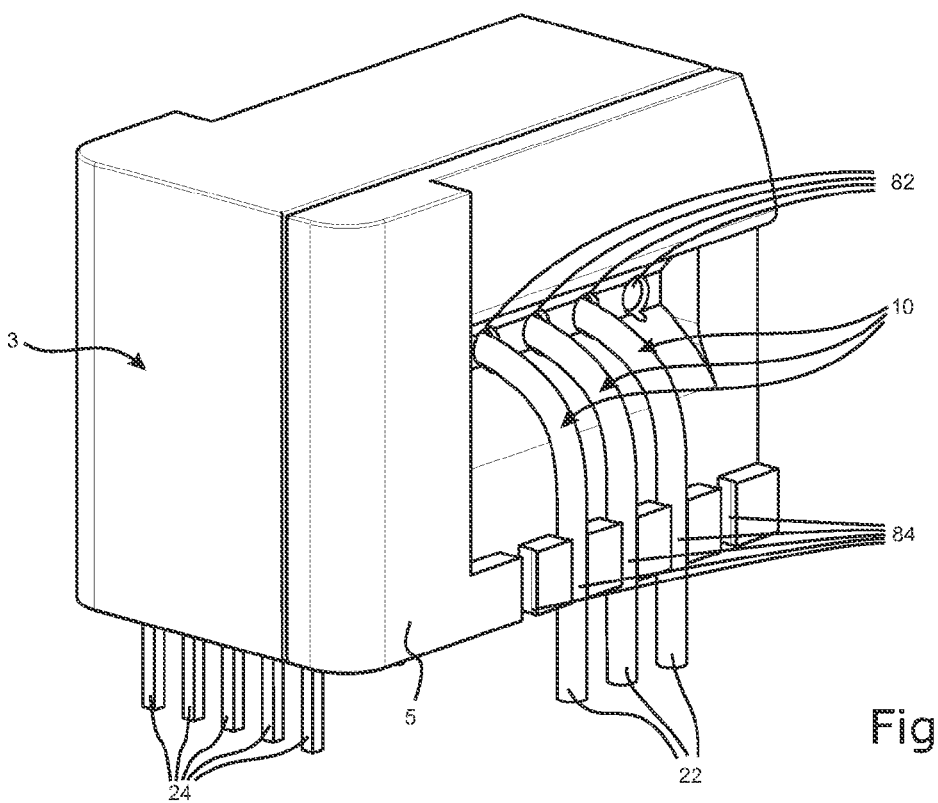
FIG. 6d is a view similar to FIG. 6a, showing a primary conductor arrangement according to a fourth variant.

In applications for differential current measurement, the primary conductors or groups of primary conductors carrying different primary currents may advantageously be separated by spacing resulting from leaving a pre-formed housing cavity 82 free, as illustrated in FIGS. 6a and 6b. The electrical creepage path on the external circuit board between primary conductors carrying different currents is thereby increased.

The ability to change the configuration of the primary conductor positions by selection of the through cavities at choice, when not all the cavities are used for mounting primary conductors, allows a greater design flexibility on the external circuit board to which the electrical current sensor is intended to be mounted or, alternatively, to an external electrical connector, while maintaining manufacturing cost low. In effect, tooling changes for producing the housing and other components are not required, the only changes being in the primary conductor assembly operation, whereby the same conductor insertion and bending tools may be used.

It may be noted that the above described housing configuration for selective insertion of primary conductors may also be advantageously implemented in an open loop current sensor (i.e. a current sensor without compensation circuit) without departing from the scope of this invention.

An advantage of the magnetic circuit according to this invention is its ability to better support electrical current surcharges in the primary conductors that sometimes occur during start-up of a device. Current surcharges create a risk of saturation of the fluxgate core before the secondary circuit compensates the generated magnetic field. The configuration of the second branch 32, in particular the partial or essentially complete wrap-around of the cavity 44 with the lateral and outer wall portions, as well as the presence of the outer wall extension 50 and/or lateral wall extension 50' provide effective protection against the problem of saturation of the fluxgate magnetic field sensor position in the cavity 44.

The invention claimed is:

1. A closed-loop current sensor comprising a magnetic circuit, a magnetic field sensor, and a compensation circuit configured to generate a magnetic field opposing a magnetic field created by an electrical current to be measured flowing in one or more primary conductors extending through a central opening of the magnetic circuit, the magnetic circuit comprising a magnetic core made of at least two core parts assembled together to form a substantially closed magnetic circuit, wherein a second branch of the magnetic circuit comprises inner and outer wall portions joined by one or more lateral wall portions at least partially surrounding a cavity portion receiving the magnetic field sensor therein, the lateral and outer wall portions extending from one or both lateral edges of the inner wall portion.

2. Sensor according to claim 1, wherein said second branch of the magnetic circuit comprises one or more extensions extending from inner, lateral or outer wall portions of a magnetic core part overlapping one or more corresponding wall portions of another magnetic core part.

3. Sensor according to claim 1, wherein there are lateral wall portions on either side of the cavity portion.

4. Sensor according to claim 1, wherein the magnetic circuit comprises an air-gap between free end edges of the inner, outer or lateral wall portions.

5. Sensor according to claim 1, wherein the magnetic core parts are sheet metal stamped and formed parts.

6. Sensor according to claim 1, wherein the magnetic core has a substantially parallelepipedic shape with opposed side branches joining opposed first and second branches, the first and second branches being split in respective core parts.

7. Sensor according to claim 6, wherein the first and second branches of the magnetic core are inserted in cavities of coil supports of the compensation circuit.

8. Sensor according to claim 7, wherein the compensation circuit comprises a pair of coils, one wound around each coil support.

9. Sensor according to claim 7, wherein the side branches of the magnetic circuit interconnecting the opposed first and second branches each comprise a reinforcement in the form of a stamped ridge or embossing.

10. Sensor according to claim 1, wherein the magnetic field sensor comprises a dielectric support, a fluxgate core mounted thereon and a fluxgate coil wound around the support and fluxgate core and wherein electrical terminals are securely fixed to the dielectric support, the terminals comprising coil connection portions for electrical connection to ends of the fluxgate coil and terminal portions for connection of the magnetic field detector to a circuit board.

11. Sensor according to claim 10, wherein the circuit board is adjacent respective ends of first and second coils of the compensation circuit.

12. Sensor according to claim 1, comprising one or more essentially U-shaped primary conductor portions extending partially around a branch of the magnetic circuit receiving the magnetic field sensor.

13. Sensor according to claim 12, comprising a housing with a plurality of preformed primary conductor guide cavities extending between opposed lateral faces of the housing through a central opening of the magnetic circuit, for insertion of one or more primary conductor portions therethrough.

14. Sensor according to claim 13, wherein the primary conductors or groups of primary conductors carrying different primary currents are separated by a spacing resulting from leaving at least one pre-formed housing cavity therebetween free.

15. Sensor according to claim 14, wherein each U-shaped primary conductor portion is bent so that it extends through a guide slot positioned in a plane orthogonal to a mounting face that is offset from a plane parallel thereto extending through the corresponding preformed cavity through which the U-shaped primary conductor extends.

16. Sensor according to claim 1, wherein the housing comprises guide slots along the lateral faces of the housing for positioning lateral branches of the primary conductor portions.

17. A current sensor comprising a housing, a magnetic circuit with a central opening, a magnetic field sensor, and one or more essentially U-shaped primary conductor portions extending partially around a branch of the magnetic circuit, wherein the housing comprises a plurality of preformed primary conductor guide cavities extending between opposed lateral outer faces of the housing through the central opening of the magnetic circuit, the preformed primary conductor guide cavities configured for insertion, after assembly of the magnetic field sensor and magnetic circuit in the housing, of said one or more primary conductor portions therethrough, and wherein the sensor has less primary conductor portions than preformed primary conductor guide cavities.

18. Sensor according to claim 17, wherein the housing comprises guide slots along the lateral faces of the housing for positioning lateral branches of the primary conductor portions.

19. Sensor according to claim 17, wherein the primary conductors or groups of primary conductors are separated by a spacing resulting from leaving at least one pre-formed housing cavity therebetween free.

20. Sensor according to claim 19, wherein each U-shaped primary conductor portion is bent so that it extends through a guide slot positioned in a plane orthogonal to a mounting face that is offset from a plane parallel thereto extending through the corresponding preformed guide cavity through which the U-shaped primary conductor extends.

21. Sensor according to claim 17, wherein the magnetic core is made of at least two core parts assembled together to form a substantially closed magnetic circuit, wherein a second branch of the magnetic circuit comprises inner and outer wall portions joined by one or more lateral wall portions at least partially surrounding a cavity portion receiving the magnetic field sensor therein, the lateral and outer wall portions extending from one or both lateral edges of the inner wall portion.

22. A closed-loop current sensor comprising a housing, a magnetic circuit, a magnetic field sensor, and a compensation circuit configured to generate a magnetic field opposing a magnetic field created by an electrical current to be measured flowing in one or more primary conductors extending through a central opening of the magnetic circuit, the magnetic circuit comprising a magnetic core made of at least two core parts assembled together to form a substantially closed magnetic circuit having a substantially parallelepipedic shape with opposed side branches joining opposed first and second branches, the compensation circuit comprising a signal processing circuit, a coil surrounding the first branch of the magnetic circuit, and a coil surrounding the second branch of the magnetic circuit, the coils being mounted on respective coil supports, wherein the signal processing circuit comprises a circuit board positioned along a face of the sensor at an end of the coils, substantially orthogonal to a mounting face of the sensor and wherein the second branch of the magnetic circuit comprises inner and outer wall portions at least partially surrounding a cavity portion with an open end adjacent the circuit board allowing the magnetic field sensor to be insertably received therein in a direction orthogonal to the circuit board.

23. Sensor according to claim 22, wherein a second branch of the magnetic circuit comprises inner and outer wall portions joined by one or more lateral wall portions at least partially surrounding a cavity portion receiving the magnetic field sensor therein, the lateral and outer wall portions extending from one or both lateral edges of the inner wall portion.

24. Sensor according to claim 22, further comprising one or more essentially U-shaped primary conductor portions extending partially around a branch of the magnetic circuit, wherein the housing comprises a plurality of preformed primary conductor guide cavities extending between opposed lateral outer faces of the housing through the central opening of the magnetic circuit, the preformed primary conductor guide cavities configured for insertion, after assembly of the magnetic field sensor and magnetic circuit in the housing, of said one or more primary conductor portions therethrough, and wherein the sensor has less primary conductor portions than preformed primary conductor guide cavities.

\* \* \* \* \*